United States Patent [19]

Blaske et al.

[11] Patent Number: 4,493,939
[45] Date of Patent: Jan. 15, 1985

[54] METHOD AND APPARATUS FOR FABRICATING A THERMOELECTRIC ARRAY

[75] Inventors: T. Allen Blaske, Plano; Terry J. Hendricks, Garland, both of Tex.

[73] Assignee: Varo, Inc., Garland, Tex.

[21] Appl. No.: 547,066

[22] Filed: Oct. 31, 1983

[51] Int. Cl.³ .......................................... H01L 35/28
[52] U.S. Cl. .................................. 136/212; 29/573;
29/588; 29/841; 62/3; 136/201; 136/203;
136/204; 136/224; 136/225; 136/230; 357/55;
357/81; 357/87
[58] Field of Search ............... 29/573, 588, 841; 62/3;
136/201, 203, 204, 212, 224, 225, 230; 357/55,
81, 87

[56] References Cited

U.S. PATENT DOCUMENTS

| | | | |
|---|---|---|---|
| 1,848,655 | 3/1932 | Petrik | 62/3 |
| 2,944,404 | 7/1960 | Fritts | 62/3 |
| 2,980,746 | 4/1961 | Claydon | 136/203 |
| 3,076,051 | 1/1963 | Haba | 136/204 |
| 3,083,248 | 3/1983 | Schumacher | 136/204 |
| 3,111,432 | 11/1963 | Sickert et al. | 136/203 |
| 3,197,844 | 8/1965 | Bassett, Jr. | 29/573 |
| 3,240,628 | 3/1966 | Sonntag, Jr. | 136/203 |
| 3,276,105 | 10/1966 | Alais et al. | 29/573 |
| 3,291,648 | 12/1966 | Sheard et al. | 136/212 |
| 3,314,242 | 4/1967 | Lefferts | 62/3 |
| 3,326,726 | 6/1967 | Bassett, Jr. et al. | 136/203 |
| 3,450,572 | 6/1969 | Rietveld | 136/203 |
| 3,509,620 | 5/1970 | Phillips | 29/573 |
| 3,560,351 | 2/1971 | Abbott et al. | 204/15 |
| 3,626,583 | 12/1971 | Abbott et al. | 29/573 |
| 3,780,425 | 12/1973 | Penn et al. | 29/573 |
| 3,781,176 | 12/1973 | Penn et al. | 136/212 |
| 4,149,025 | 4/1979 | Niculescu | 136/206 |

Primary Examiner—Leland A. Sebastian
Attorney, Agent, or Firm—Jerry W. Mills; Gregory M. Howison; Nina Medlock

[57] ABSTRACT

A method and apparatus for fabricating a thermoelectric device includes forming a matrix board (12) with an array of orifices (100) formed therein. A plurality of P-type thermoelements (96) are formed and then a vacuum chuck (92) is utilized to dispose alternating ones of the elements (96) into the alternating ones of the orifices (100). A plurality of N-type elements (108) is formed and a vacuum chuck (104) is utilized to dispose alternating ones of the elements (108) into the remaining orifices (100) of the matrix (12). This forms an assembled array (52). A plurality of conductive tabs (114) is placed onto the P-type elements (98) and N-type elements (108) by a vacuum chuck (116). A second set of conductive tabs (120) is disposed on the opposite side of the assembled array by a vacuum chuck (124). A solder flow oven (54) and a solder flow oven (76) are utilized to reflow the solder on the tabs between the two operations. After connecting the tabs, the assembly (78) is moved to an epoxy station (80) to form an epoxy layer around the peripheral surfaces thereof to form a void (146) in the center portion thereof.

43 Claims, 16 Drawing Figures

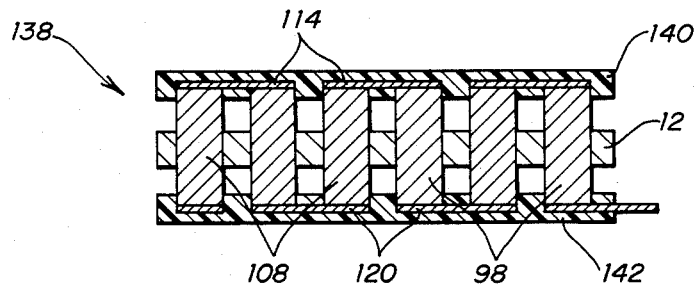
FIG. 9
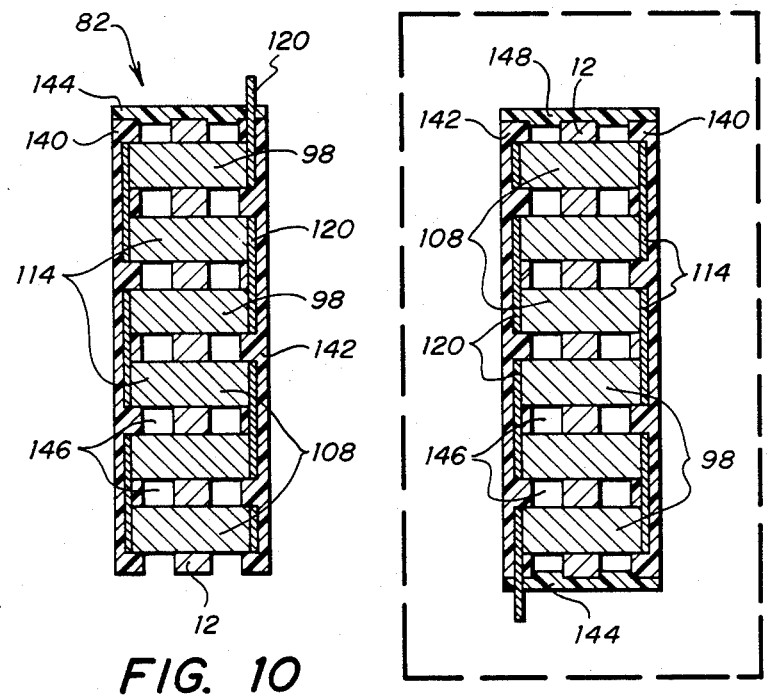
FIG. 10
FIG. 11

METHOD AND APPARATUS FOR FABRICATING A THERMOELECTRIC ARRAY

TECHNICAL FIELD

The present invention relates to the manufacture of thermoelectric devices, and more particularly, relates to a method for fabricating thermoelectric devices, and to the manufactured devices, having arrays of thermocouples which operate using the Peltier or Seebeck effects.

BACKGROUND OF THE INVENTION

Thermoelectric devices comprising a plurality of thermocouples formed from a P-type thermoelement and an N-type thermoelement have long been known for producing heating or cooling. Such devices generally used a P-type semiconductor or thermoelement connected to an N-type semiconductor or thermoelement. Depending upon the direction of the current flowing across the N and P junctions, the devices may produce heating or cooling at the junction.

Many different techniques have been heretofore used to construct or fabricate such thermoelectric devices. The majority of such prior techniques have required a substantial amount of manual steps, thus creating a high cost of manufacture, as well as producing quality control problems. Moreover, such thermoelectric devices are made up of various small brittle elements which are subject to fracture or breakage under rough handling. The brittle nature of the elements creates additional problems in fabrication utilizing manual techniques, and also presents problems when the devices are utilized in hostile environments.

Numerous techniques have been heretofore developed to manufacture thermoelectric arrays. U.S. Pat. No. 2,980,746 issued to Claydon on Apr. 18, 1961, discloses the use of a jig formed in the shape of an egg box to provide a rectangular array of cells or pockets. P and N elements are disposed in the pockets in U-shaped aluminum connectors and then connected on opposite ends of the P-N type elements. The jig is then removed and the assembly is potted in a heat insulating resin. This technique still, however, required manual placing of the individual elements in making the electrical contacts and removing the jig. Therefore, this technique did not solve the problems of eliminating manual intervention while providing thermoelectric array of superior operating characteristics.

Because it is difficult to properly align and form such small N and P elements, techniques using patterns and jigs have been heretofore utilized. Such a technique is disclosed in U.S. Pat. No. 3,276,105 issued to Alais, et al., on Oct. 4, 1966. Again, however, such techniques require manual intervention with the above-described problems.

Various other techniques for forming thermoelectric devices are disclosed in U.S. Pat. No. 3,781,176 to Penn, et al., issued on Dec. 25, 1973; U.S. Pat. No. 3,780,425 issued to Penn, et al., on Dec. 25, 1973 and U.S. Pat. No. 3,560,351 issued to Abbott, et al., on Feb. 2, 1971. However, none of these prior art techniques has presented a technique for forming an array of N-P thermoelectric elements in an assembly line fashion without the requirement of substantial manual intervention in which to produce a thermoelectric array of superior operating characteristics and strength.

While such prior thermoelectric arrays have been encapsulated in insulating material, such encapsulation in certain devices has not optimized the operating characteristics of the devices. A need has arisen for a technique for encapsulating thermoelectric arrays in order to maintain the structural stability of the arrays and while protecting the arrays from exterior damage, yet providing an optimum thermal insulation within the interior of the device.

SUMMARY OF THE INVENTION

In accordance with the present invention, a method and apparatus are provided which substantially eliminate or reduce the problems associated with the prior art techniques.

In accordance with the present invention, a method of fabricating a thermoelectric device includes simultaneously depositing a plurality of first-type thermoelements in a matrix member in a first spaced apart configuration. A plurality of second-type thermoelements are then simultaneously deposited in the matrix member in a second spaced apart configuration to form an alternately disposed array of first and second thermoelements within the matrix member. A plurality of conductive members is then deposited and secured on opposite sides of the array of the first and second thermoelements in order to connect the elements in series.

In accordance with another aspect of the invention, a system is provided for fabricating thermoelectric arrays which include apparatus for separating a body of P-type conductivity material into a plurality of P-type elements. A matrix is provided which defines a plurality of cells. A first apparatus is provided to transport selected ones of the P-type elements to the matrix and to deposit the P-type elements in alternate ones of the cells. Apparatus is also provided to separate a body of N-type conductivity material into a plurality of N-type elements. A second apparatus is provided to transport selected ones of the N-type elements to the matrix to deposit the N-type elements in alternate ones of the cells, such that the matrix is filled with alternating P and N-type elements. Electrical contacts are then connected to the alternating P and N-type elements to perform a P-N thermoelectric array.

In accordance with yet another aspect of the invention, a thermoelectric array is formed which includes a plurality of P-type and N-type conductivity elements arranged in an alternating array. Contacts electrically connect the elements together to form a series of P-N junctions. Encapsulating material seals the exterior surfaces to form a unitary body. A central void area is defined within the unitary body and communicates with central portions of each of the elements. The void area may have a pressure less than atmospheric pressure.

In accordance with a further aspect of the invention, a method of forming a thermoelectric array includes the formation of an array of alternating P-type and N-type conductivity elements. Contacts are then electrically connected to adjacent ones of the P-type and N-type elements to form a unitary body. Encapsulating material is applied to sequential exterior surfaces of the unitary body while reduced pressure is maintained about the unitary body. The interior of the unitary body may be maintained at a pressure less than atmospheric pressure when the last exterior surface is encapsulated, in order to form a void within the thermoelectric array having a low pressure.

BRIEF DESCRIPTION OF THE DRAWINGS

For a more detailed description of the construction and operation of the present invention, reference is now made to the following description taken in conjunction with the accompanying Drawings in which:

FIG. 9 illustrates a sectional view of the array with epoxy on both the top and bottom surfaces;

FIG. 10 illustrates a sectional view with epoxy coating on three sides;

FIG. 11 illustrates the assembled array with epoxy on all six surfaces and a void therebetween;

DETAILED DESCRIPTION OF THE INVENTION

Figure 1:
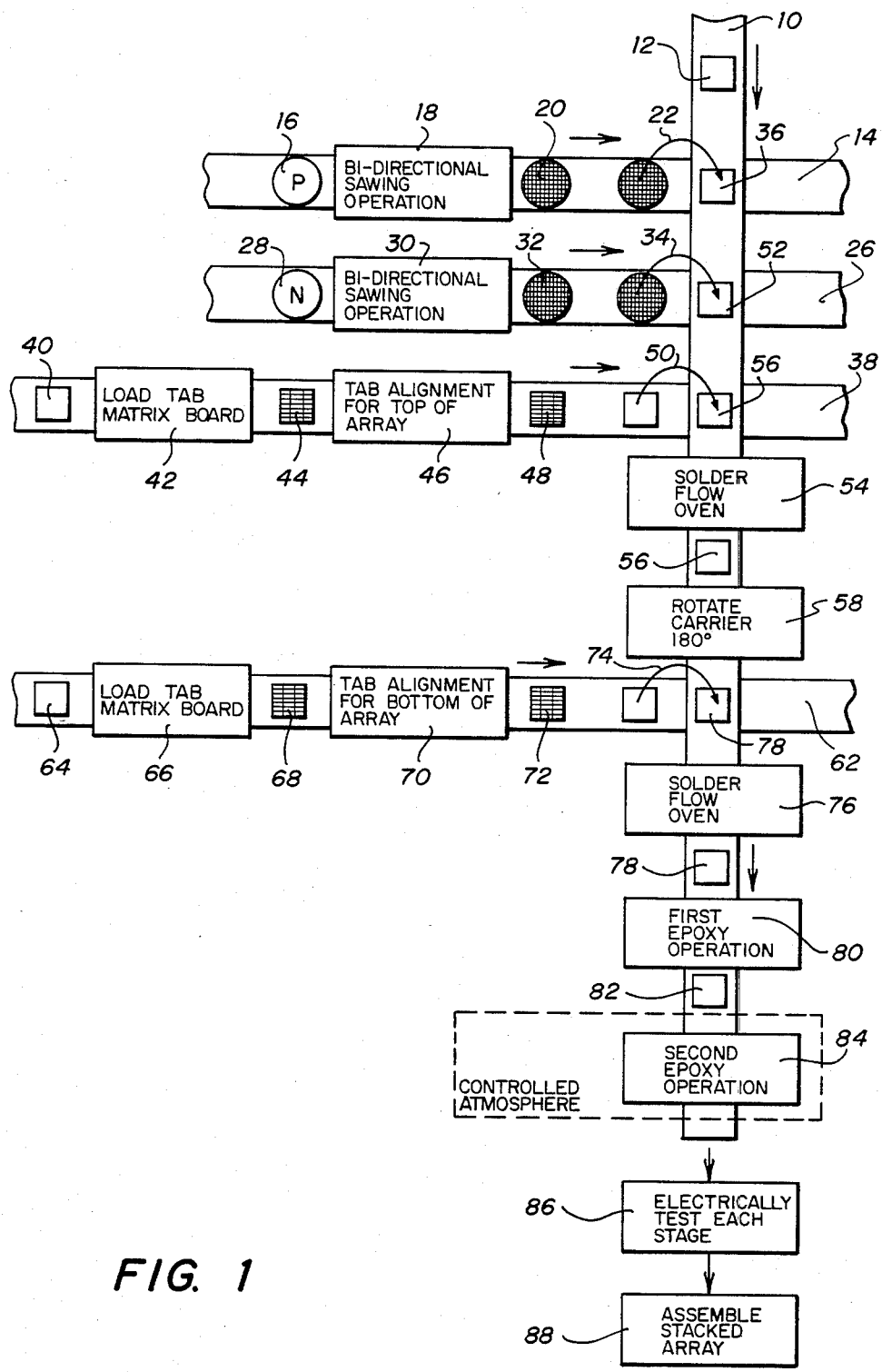
FIG. 1 illustrates a planar view of the method and apparatus of the present invention in schematic format.

Referring now to FIG. 1, there is illustrated a planar view of a schematic of the method and apparatus of the present invention. For illustrative purposes, the assembly process is depicted with conveyor belts and dedicated process station when, in actuality, certain steps described hereinbelow can be performed separately. Although the invention is described specifically with respect to fabrication of a cooling device, it will be understood that the invention can be used in the formation of a thermoelectric generating device.

The apparatus is comprised of a main conveyor belt 10 upon which a primary matrix board 12 is placed for movement therewith. A secondary conveyor belt 14 is disposed at right angles with respect to the main conveyor belt 10 and is operable to carry semi-conductor materials therealong. The semi-conductor materials that are carried along the conveyor belt 14 are utilized, as will be described hereinbelow, for assembly into the matrix board 12. A wafer 16 of single crystal, polycrystalline or pressed and sintered material is disposed on one end of the conveyor 14. The wafer 16 is doped such that it is of P-type semiconductor material.

A bi-directional sawing operating station 18 is disposed along the path of the conveyor 14 such that the P-type wafer 16 has the surface thereof segmented in a desired pattern. In the preferred embodiment, the pattern is a plurality of parallel vertical and horizontal lines defining a matrix of elements. After processing by the bi-directional sawing operating station 18, an array 20 of P-type elements emerges.

The array 20 passes along with the conveyor 14 to an operating station 22 which represents the operation in which select ones of the segmented P-type elements are placed onto the matrix board 12. The placement of P-type elements into the matrix board 12 forms an assembly 36. The operation of the placement of select ones of the P-type elements in the array 20 will be discussed hereinbelow.

A conveyor 26 is disposed at right angles to the main conveyor 10 and further along the progression thereof with respect to the conveyor 14. A wafer 28 of single crystal, polycrystalline or pressed and sintered material doped as an N-type semiconductor material is disposed on one end of the conveyor 26. A second bi-directional sawing operation 30 is disposed in the path of the conveyor 26 such that the N-type wafer 28 is passed thereby for segmentation thereof to yield an array 32 of N-type elements. The segmenting of the array 28 is similar to the segmenting of the array 16. Although the dimensions of arrays 16 and 18 are shown to be similar, in some applications it will be desirable to use arrays of differing dimensions. Although two bi-directional sawing operations are illustrated, it should be understood that the P-type array 16 and the N-type array 28 can be formed with one operating station prior to placement onto the conveyors 14 and 26, respectively. As will be described hereinbelow, it is only important that the P-type array 20 and the N-type array wafer 32 be properly located on the conveyors 14 and 26, respectively.

The N-type array 32 is moved with the conveyor 26 to an operating station 34 which represents the operation in which a select number of the N-type elements in the array 32 are placed onto the assembly 36 on the main conveyor 10. The matrix board 12 has already been processed at the point 22 and has P-type elements from the array 20 already disposed thereon. The addition of the N-type elements from the array 32 yields an assembly 52, the configuration of which will be described hereinbelow.

A conveyor 38 is disposed at right angles to the main conveyor 10 and placed further along the line of progression thereof than the conveyor 26. A tab matrix board 40 is disposed on one end of the conveyor 38. A tab loading operation station 42 is disposed adjacent the conveyor 38 and represents the operation in which the tab matrix board 40 is loaded with solder-clad conductive tabs to yield a loaded tab matrix board 44 having tabs disposed therein. However, the tabs in the tab matrix board 44 are not properly aligned with a matrix pattern disposed therein, as will be described hereinbelow. An alignment station 46 is disposed adjacent the conveyor 38 and is stationary with respect thereto. The alignment station 46 represents the operation in which the tabs are aligned with the pattern in the matrix board 44 to yield a loaded tab matrix board 48 with aligned tabs therein. The tab matrix board 48 progresses along with the conveyor 38 to an operation station 50 which represents the operation wherein the tabs in the tab matrix board 48 are disposed on top of the P-type and N-type elements in the assembly 52 to yield an assembly 56. As will be described hereinbelow, a layer of solder or some type of electrically conductive adhesive material is disposed between the tabs and the P-type and N-type elements that are disposed in the matrix board 12.

A solder flow oven 54 is disposed adjacent the main conveyor 10 at a point further in the progression thereof than the conveyor 38. The solder flow oven 54 is operable to reflow the solder which is used in the preferred embodiment between the conductive tabs and the P-type and N-type elements disposed in the matrix board 12 of the assembly 56. This secures the conductive tabs on the assembly 56.

The assembly 56 progresses along with the main conveyor 10 until it is adjacent a carrier rotator station 58. The carrier rotator station 58 is disposed stationary with respect to the main conveyor 10 and represents the operation in which the assembly 56 is rotated or inverted such that the surface opposite the conductive tabs is exposed. A rotation or inversion of 180° is required.

A conveyor 62 is disposed at right angles to the main conveyor 10 at a point proximate the output of the carrier rotator station 58. A tab matrix board 64 is disposed on one end of the conveyor 62 and is operable to pass adjacent a tab loading operation station 66 that is stationary with respect to the conveyor 62. As the conveyor 62 carries the tab matrix board 64 by the station 66, tabs are loaded in the tab matrix board 64 to yield a loaded tab matrix board 68. The tab matrix board 68 passes along with the conveyor 62 proximate an alignment station 70. The alignment station 70 is similar to the alignment station 46 and is operable to align the tabs in the tab matrix board 68 in the pattern defined therein. A loaded solder-clad tab matrix board 72 is output from the alignment station 70 with aligned tabs therein.

The loaded tab matrix board 72 progresses along with the conveyor 62 to an operating station 74 that represents the operation in which the aligned tabs in the loaded tab matrix board 72 are disposed on the exposed surface of the rotated assembly 56 to connect the N-type and P-type elements therein in a predetermined pattern to form an assembly 78. As was the case with the operation station 50, the tabs and/or the exposed surface of the P-type and N-type elements have a layer of solder disposed thereon.

A solder flow oven 76 is disposed proximate the main conveyor belt 10 in the path of the assembly 78 and is stationary with respect to the progression thereof. The solder flow oven 76 is similar in operation to the solder flow oven 54 and is operable to secure the tabs disposed on the assembly 78 to the surfaces of the P and N-type elements disposed in the matrix board 12. The assembly 78 progresses along with the main conveyor 10 to a first epoxy station 80 in which a partial encapsulation of the assembly 78 is performed to yield a partially encapsulated assembly 82 on the output thereof. The partially encapsulated assembly 82 is passed along with the main conveyor 10 to a second epoxy station 84 in which the assembly 82 is encapsulated. This operation, as will be described hereinbelow, is performed in a controlled atmosphere. After total encapsulation, the assembly is passed along to a test station 86 to electrically test the assembled thermoelectric device and then to an assembly station 88 to assemble the thermoelectric devices in stages, if desired.

Figure 2:
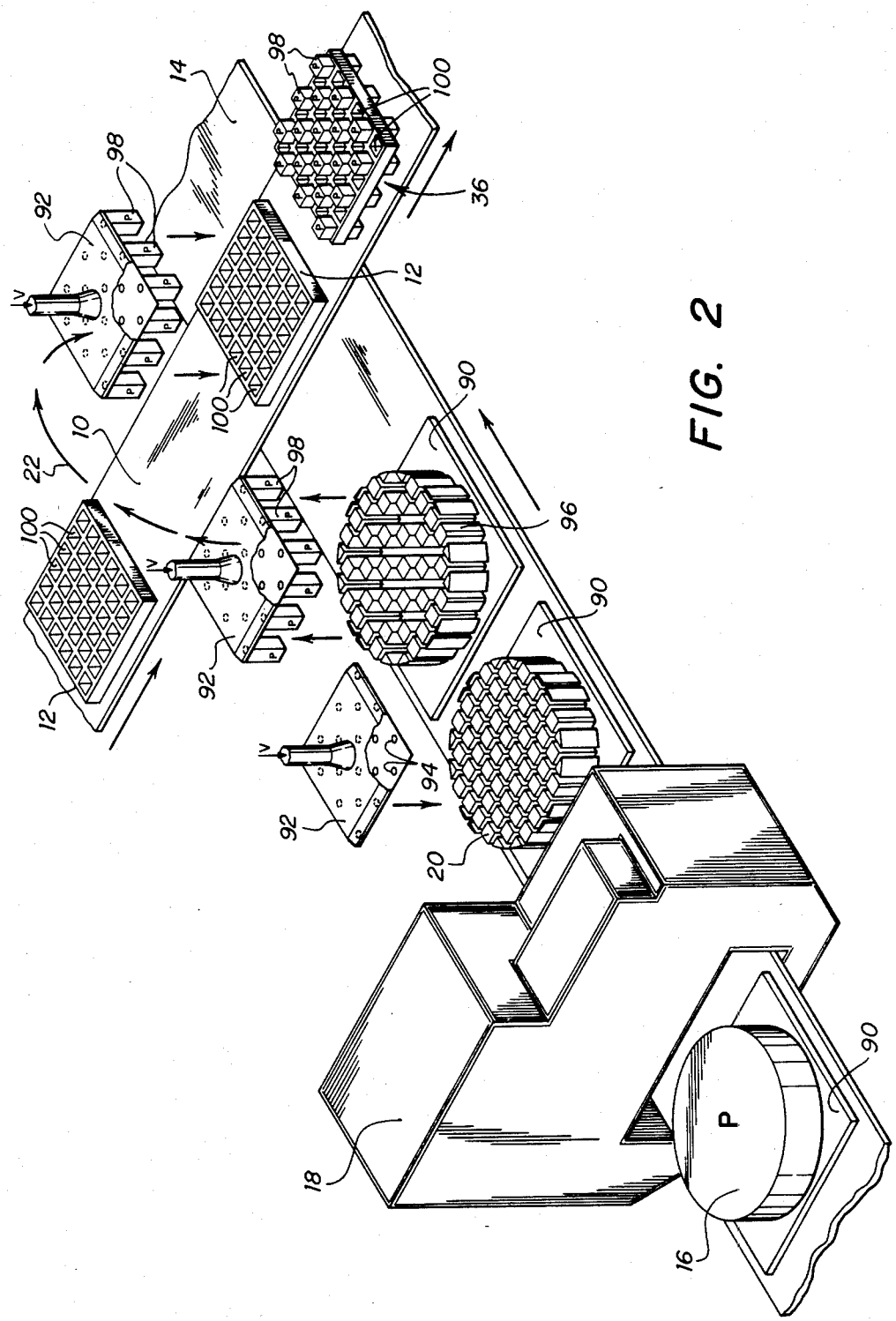
FIG. 2 illustrates a perspective view of the step in which the P-type elements are placed into the matrix.

Referring now to FIG. 2, there is illustrated a perspective view of the operation of segmenting the P-type wafer 16 and passing it to the operating station 22. The P-type wafer 16 is normally mounted upon a carrier 90 and adhered thereto by a compound such as wax to secure the wafer during the sawing operation 18. The sawing operation 18 involves conventional techniques for sawing, dicing and cleaning semiconductor wafers. Normally, plating of the material is performed between sawing the wafer and dicing the wafer. As an example, a 0.030 to 0.100 inch wafer of $Bi_2Te_3$ may be utilized with Ni or Sn plating, although it will be understood that a wide variety of sizes and shapes of wafers could be used. During the sawing and dicing operation, the elements resulting therefrom can be processed through a quality control step (not shown) to determine the integrity of the individual elements. In this manner, the defective elements can be eliminated. After selection, the accepted elements are placed in the array 20. The array 20 can be a sub-matrix board that has a plurality of orifices disposed therein in a predetermined pattern, as will be described hereinbelow. The elements can be hand selected and placed in this sub-matrix board in the various orifices therein.

To remove the segmented elements in the array 20, a vacuum chuck 92 is utilized. The vacuum chuck 92 has a plurality of small orifices 94 arranged on the lower surface thereof in a predetermined pattern. By properly orienting the chuck 92 with respect to the surface of the P-type segmented wafer 20, the orifices 94 disposed therein can be aligned with select ones of the elements in the segmented P-type wafer 20. At the operating station 22, the vacuum chuck 92 raises up selected P-type elements 98 by disposing a negative pressure on the surfaces thereof and leaves behind unselected P-type elements 96.

The primary matrix board 12 may be fabricated from a material with low thermal and electrical conductivity, such as Kapton or other suitable material. The board 12 has a plurality of orifices 100 disposed therein. The orifices 100 can be formed by a machining step or an etching step.

The vacuum chuck 92 with the P-type elements 98 attached thereto is raised and aligned over the matrix board 12 such that lowering thereof will allow the P-type elements 98 to be disposed in select ones of the orifices 100. The vacuum can then be removed from the vacuum chuck 92 to allow the P-type elements 98 to remain in the matrix board 12. If necessary, a positive pressure can be produced within the vacuum chuck 92 to prevent adherence to the surface of the chuck 92 by any of the P-type elements 98. When so disposed, the assembly 36 is formed with the P-type elements 98 disposed in alternating ones of the orifices 100.

Figure 3:
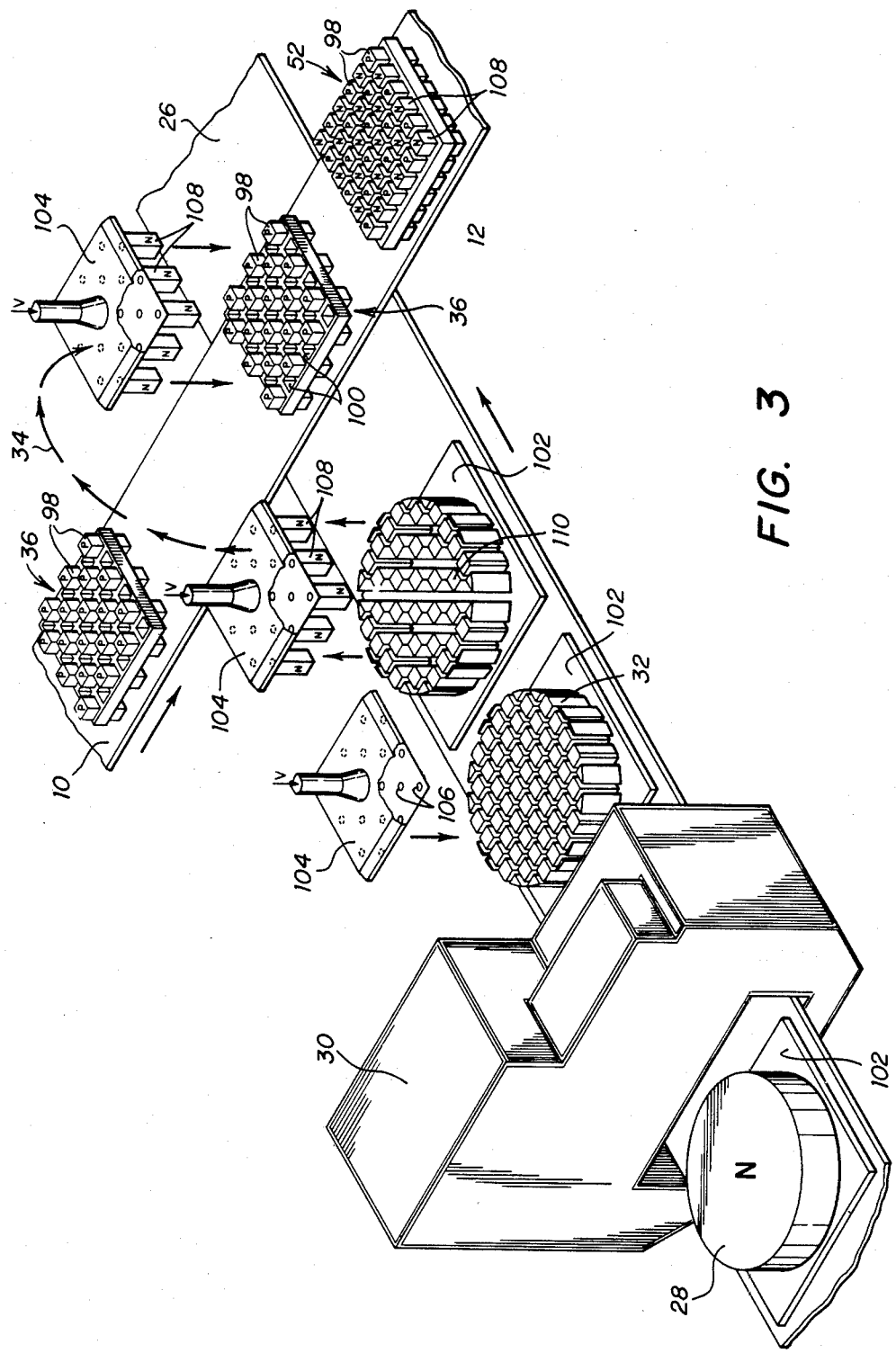
FIG. 3 illustrates a perspective view of the step in which the N-type elements are placed into the matrix.

Referring now to FIG. 3, there is illustrated a perspective view of the conveyor 26 and the operating station 34. The N-type wafer 28 is disposed on a carrier 102 and adhered thereto for stabilization during the sawing operation 30. The sawing operation 30 is identical to the sawing operation 18. As noted above, these sawing operations may be performed separately prior to placing matrix boards 12 on the conveyor 10.

After sawing, a vacuum chuck 104, similar to the vacuum chuck 92, is disposed over the elements of the array 32. The vacuum chuck 104 has a plurality of vacuum orifices 106 disposed in the undersurface thereof in a predetermined pattern that are operable to be aligned with individual elements of the array 32. The elements that are selected are alternate ones as compared to the elements selected from the array 90 by the vacuum chuck 92.

The vacuum chuck 104 applies a vacuum to selected elements 108 of the array 32 and leaves behind a plurality of unselected elements 110. The selected elements 108 are transported by the vacuum chuck 104 to a point above the assembly 36 which already has P-type elements 98 disposed in alternate ones of the orifices 100. The vacuum chuck 104 is operated to lower the N-type elements 108 into the remaining orifices 100 in the matrix board 12. This results in the assembly 52 having P-type elements 98 and N-type elements 108 disposed in the matrix board 12 in an alternating relationship or array.

Figure 4:
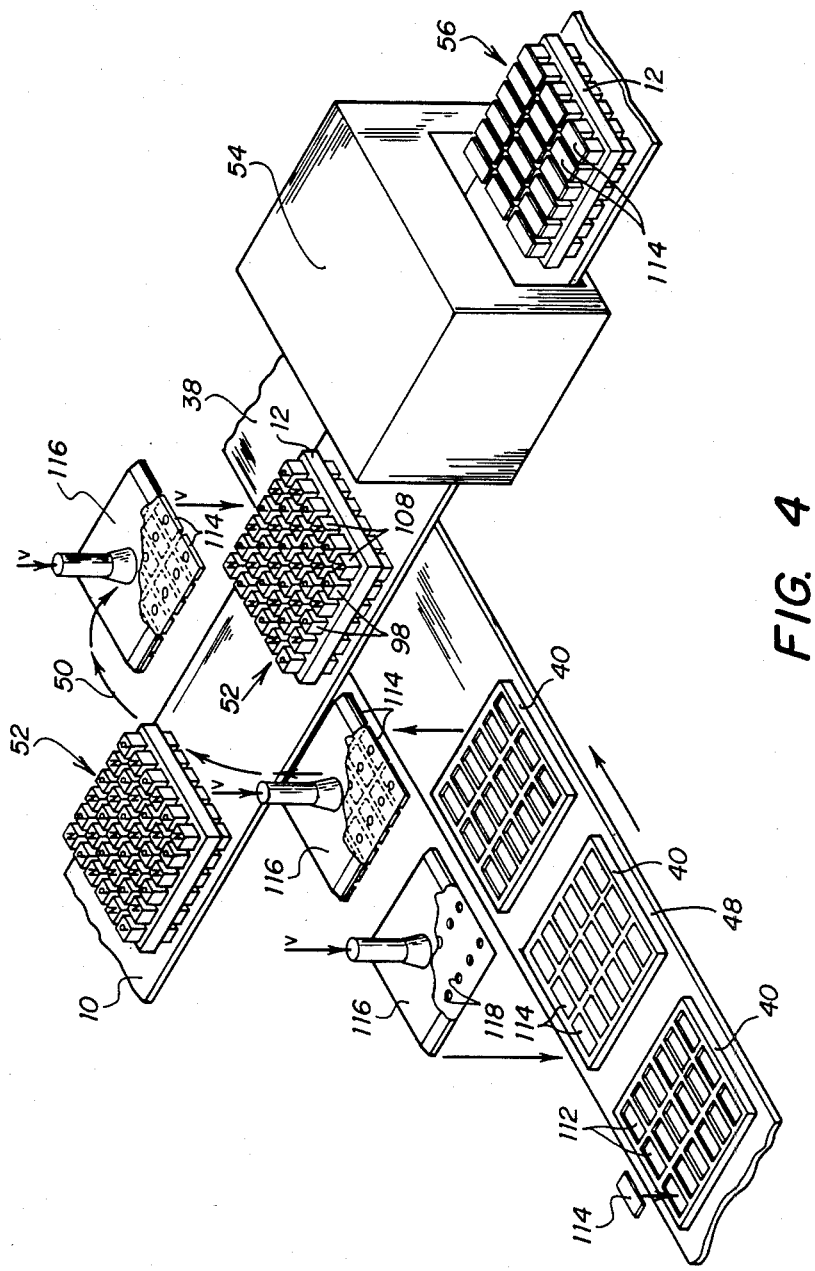
FIG. 4 illustrates a perspective view of the step in which the connecting tabs are placed onto one side of the array.

Referring now to FIG. 4, there is illustrated a perspective view of the operating station 50. For simplicity purposes, the steps for loading the tab matrix based 40 with the tabs at the station 42 and the step of aligning the tabs into the respective indentations in the tab matrix board 40 are eliminated. The tab matrix board 40 has a plurality of indentations 112 disposed therein for receiving conductive tabs 114 therein. Essentially, a plurality of the tabs 114 is disposed over the surface of the tab matrix board 40 and vibration thereof results in one of the tabs 114 falling into each of the indentations 112. The vibration is continued until there is a reasonable certainty that all the indentations 112 have a tab 114 disposed therein. The tabs 114 can be fabricated from molybdenum, Kovar, copper, gold, silver, aluminum, nickel, tungsten, or other elements or alloys which are reasonably good thermal and electrical conductors. Once filled, the loaded tab matrix board 48 is formed.

A vacuum chuck 116 having a plurality of vacuum orifices 118 disposed on the undersurface thereof in a predetermined pattern is disposed adjacent the assembly 48 such that the orifices 118 line up with individual ones of the tabs 114. The vacuum is applied and then the vacuum chuck 116 is moved over the top of the assembly 52. The vacuum chuck 116 is then aligned such that the tabs 114 bridge between select ones of the N-type elements 108 and the P-type elements 98 in the matrix board 12.

The tabs 114 can be coated with solder or, alternatively, the surface of the P-type elements 98 and the N-type elements 108 can be coated with solder. It is then only necessary to reflow the solder between the tabs 114 and the elements within the assembly 52 to provide an attachment therebetween. Since current flows from an N-type element 108 to a P-type element 98 through a tab 114 disposed on the top thereof, it is important that the conductivity between the tabs 114 and the elements be optimized. To accomplish this, the tabs are fabricated from a highly conductive material having a width essentially equal to but slightly less than the surface dimensions of the elements 98 and 108. This is necessary in order to maximize the cross-sectional area of the tab 114 in order to minimize the resistance within the tab 114. If, for some reason, the tab is slightly off the element, the actual resistance of the connection between the tab 114 and the elements 98 and 108 will increase slightly. Joule heating in the tabs and the connections thereto could prove to be detrimental in the final assembly. In addition, misalignment of the tabs 114 can cause undesired bridging between adjacent P-type/N-type couples formed from a P-type element 98 and an N-type element 108. This would severely reduce the thermoelectric cooling capacity of the entire assembly. Therefore, it is necessary that the vacuum chuck 106 with the tabs 114 attached thereto be precisely aligned with the elements 98 and 108 in the matrix board 12. The matrix board 12 facilitates this operation in that the elements 98 and 108 are predisposed at defined locations with respect thereto. By fabricating the matrix board to relatively tight tolerances, alignment of the tabs 114 with respect to the elements 98 and 108 is facilitated.

After disposing the tabs 114 on the surface of the elements 98 and 108 in the assembly 52 with solder disposed therebetween, the assembly 52 is passed through the solder reflow oven 54 to reflow the solder between the tabs 114 and the surfaces of the elements 98 and 108 to form the assembly 56.

Figure 5:
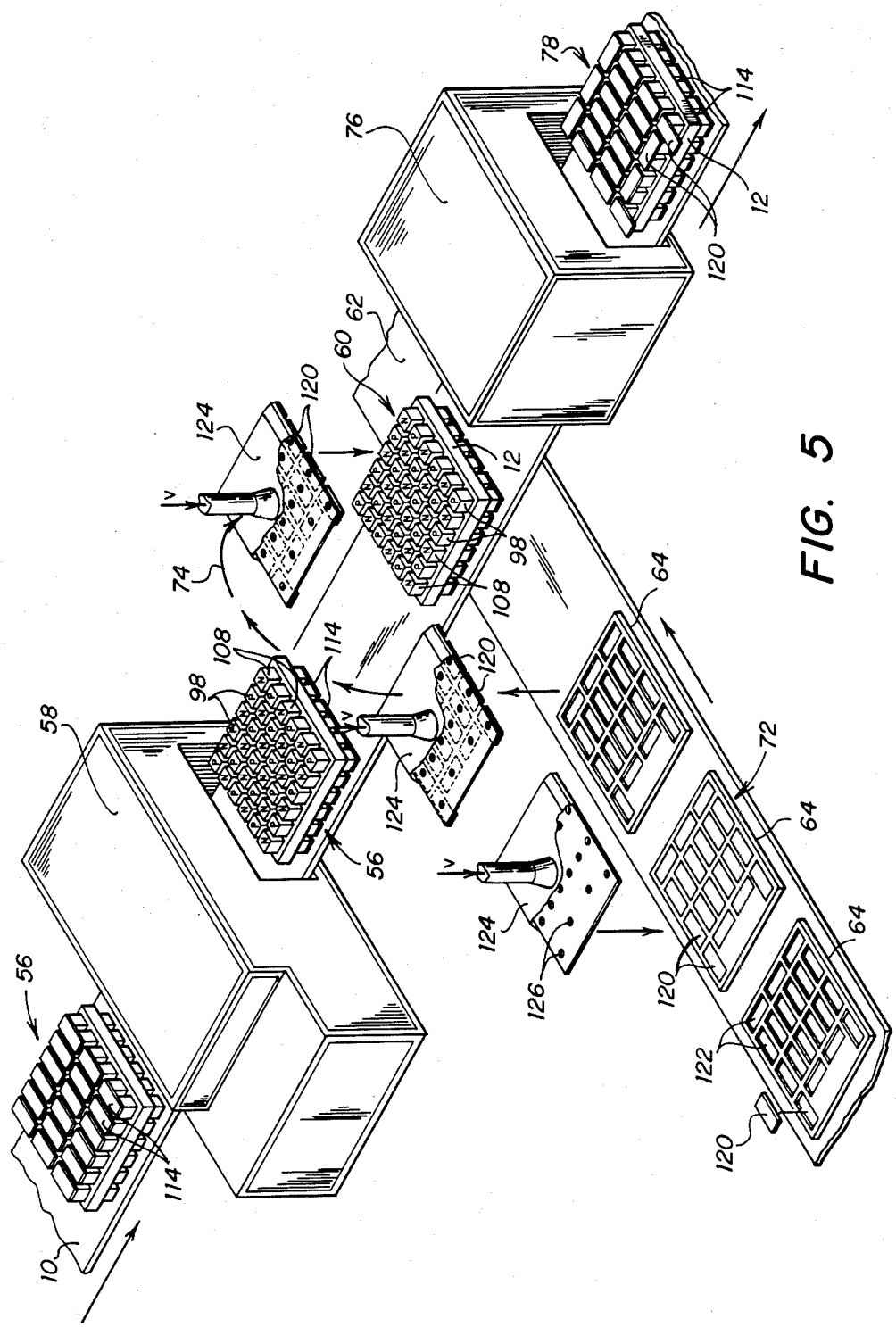
FIG. 5 illustrates a perspective view of the step in which the connecting tabs are placed on the other side of the array.

Referring now to FIG. 5, there is illustrated a perspective view of the operating station 74. As described above, after the assembly 56 is formed, it is processed through the carrier rotator station 58 to invert the assembly 56 and dispose the tabs 114 on the bottom thereof adjacent the surface of the conveyor 10.

As described above, the second tab matrix board 64 has tabs disposed thereon. This operation is represented in schematic form in FIG. 5. A plurality of tabs 120 is inserted into a plurality of indentations 122 in the tab matrix board 64 by the tab loading station 66 and the alignment station 70 to form the loaded tab matrix board 72. A vacuum chuck 124 with a plurality of orifices 126 disposed on the under-surface thereof is lowered adjacent the surface of the assembly 72 such that the orifices 126 are aligned with individual ones of the tabs 120. The vacuum chuck 124 then applies a vacuum and lifts the tabs 120 from the tab matrix board 64 and disposes them over the assembly 56 to form an assembly 78. The vacuum chuck 124 then lowers the secured tabs 120 onto the surfaces of the P-type elements 98 and the N-type elements 108 that are disposed in the matrix board 12. The tabs 120 and/or the surfaces of the elements 98 and 108 are coated with a solder, as described above with reference to the operation in FIG. 4. The assembly 78 with the tabs 120 disposed thereon is then passed through the solder reflow oven 76, as described above.

Figure 6:
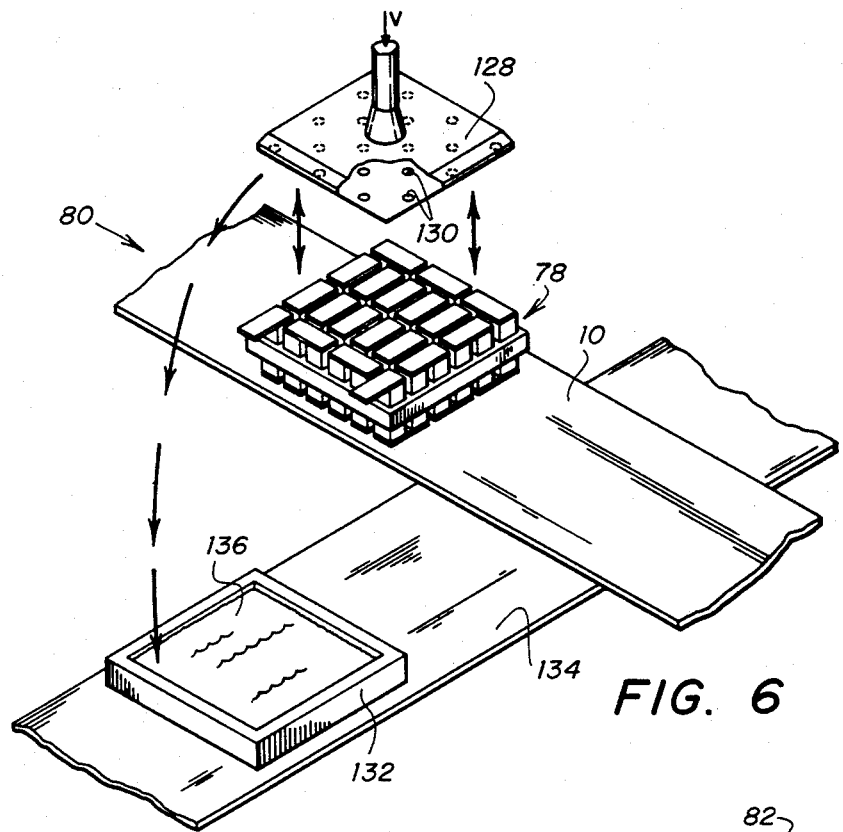
FIG. 6 illustrates a perspective view of the step in which the array is placed into an epoxy dip.

Referring now to FIG. 6, there is illustrated a perspective view of the operation performed in the first epoxy station 80. A vacuum chuck 128 having a plurality of orifices 130 disposed in the bottom thereof is operable to lift the assembly 78 off of the main conveyor 10. The assembly 78 that is attached to the vacuum chuck 128 is then moved to a dish 132 that is disposed on a conveyor 134 disposed at right angles to the main conveyor 10. The dish 132 is filled with an encapsulant 136. The encapsulant can be uncured epoxy or a similar material. The assembly 78 is immersed into the encapsulant 136 a sufficient amount to coat one surface of the assembly 78. The encapsulant 136 is then allowed to cure on the one surface of the assembly 78 to form the assembly 82 with a layer 140 of cured encapsulant on one surface thereof, as illustrated in FIG. 7.

Figure 7:
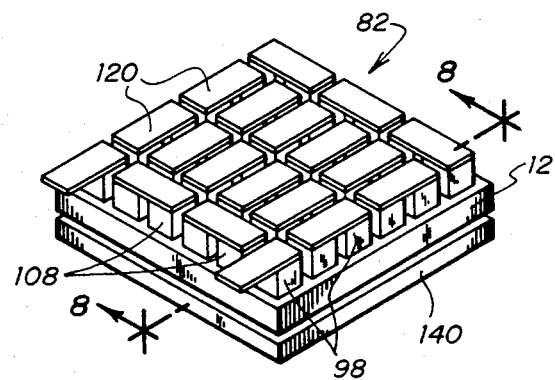
FIG. 7 illustrates a perspective view of the array processed in the step in FIG. 6.
Figure 8:
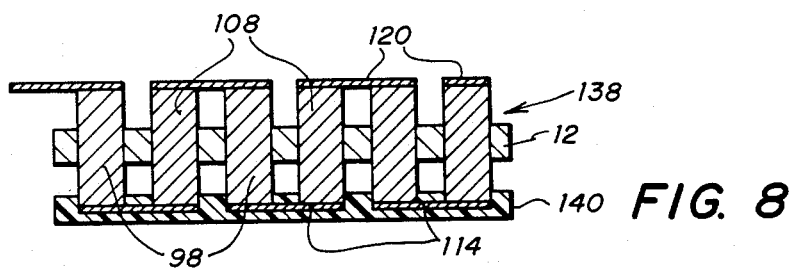
FIG. 8 illustrates a sectional view taken along lines 8—8 of FIG. 7.

With reference to FIG. 7, the assembly 82 has the layer of encapsulant 140 disposed on the lower surface thereof. The layer of encapsulant 140 does not extend up to the mother matrix board 12. This is best illustrated in FIG. 8 which is a sectional diagram taken along the lines 8—8 in FIG. 7. As can be seen from the sectional view of FIG. 8, there is a space between the mother matrix board 12, the layer 140 and each of the P-type elements 98 and the N-type elements 108. After forming the layer 140 on the assembly 82, the assembly 82 is then rotated and the opposite surface of the assembly 82 immersed into the encapsulant 136 to form a layer of cured or solidified encapsulant 142, as illustrated in FIG. 9. FIG. 9 is the same sectional view illustrated in FIG. 8. After forming the layer 142, the assembly 82 is rotated and one side thereof dipped back into the encapsulant 136 to form a layer of cured encapsulant 144. Although not shown, two of the remaining three sides are then also encapsulated with a layer of encapsulant 136 to form cured layers, thereby forming a void 146 between the layers 140, 142 and 144 in the remaining two side layers. This void 146 is open at one end of the assembly 82 only.

After forming encapsulant layers on five sides of the assembly 82, the assembly 82 is moved to the second epoxy station 84 which is similar to the first epoxy station 80, as illustrated in FIG. 6. In this epoxy station, the assembly 82 has the remaining side thereof dipped into an encapsulant to seal this side. However, in this step, an inert artificial atmosphere, such as a vacuum or an inert gas such as nitrogen, is utilized. This inert atmosphere fills the void 146 with the inert atmosphere or, alternatively, creates a vacuum or pressure therein. A layer of cured encapsulant 148 is then disposed over the remaining open side to form a seal. At this point, the void 146 is either a vacuum, a pressure or be filled with an inert gas.

The use of a vacuum or an inert gas in the void 146 reduces the thermal conductance between the layers 140 and 142. When current is applied through the P-type elements 98 and the N-type elements 108, the Peltier effect results to provide a cooling effect. Depending upon the direction of the current through the elements 98 and 108 and the tabs 120 and 114, either layer 140 or 142 will be a coolant layer. To minimize any thermal transfer path between the two layers 140 and 142, it is necessary to reduce the thermal conductance of the void 146. By utilizing a vacuum therein or an inert gas, the thermal conductance is reduced as compared to air.

Figure 12:
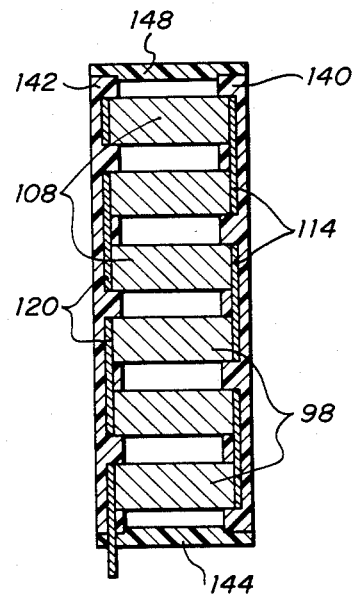
FIG. 12 illustrates another embodiment of the view of FIG. 11 with the matrix board removed.

If, for some reason, a portion of the layer 142 or a portion of the layer 140 enters the void 146, a slight increase in thermal conductance between the two surfaces results. However, the thermal conductance is still less than that with air disposed in the void 146. The thermal conductance path can be further reduced by removing the matrix board 12, as illustrated in FIG. 12. In order to remove the matrix board 12 at this step, it is necessary to fabricate the matrix board 12 from a "consummable" material that can be dissolved or otherwise removed prior to performing the final epoxy operation 84. For example, the board 12 could be made from a liquid soluble material such as the material sold by Spraylet Corporation under the tradename "Spraylet 1515". When such consumable material is used, the assembly shown in FIG. 9 could be dipped in liquid, thereby removing the board 12. The assembly may then be encapsulated as described herein.

The initial layers placed on the assembly in the first epoxy station 80 provides the structural stability necessary to maintain the P-type elements 98 and the N-type elements 108 in the proper relationship without the need for the mother matrix board 12.

Alternatively, the matrix board 12 can be constructed from a permanent, structurally sound material such as tungsten or the like. Such a reusable board 12 could be physically removed from the assembly in the manufacturing process after one side of the assembly had been epoxed, but wherein the conductive tabs had not yet been applied to one side. Suitable variations in the manufacturing process previously described would be required to physically remove such a board.

Figure 13:
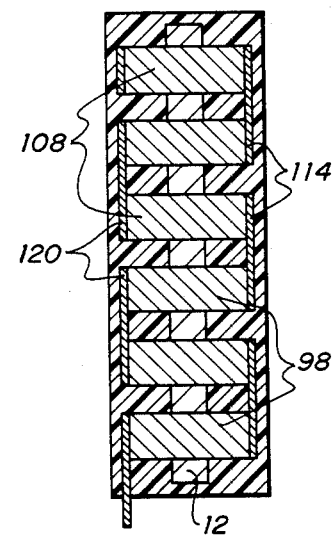
FIG. 13 illustrates the array with the matrix board totally encapsulted.

In an alternate embodiment, as illustrated in FIG. 13, the assembly 78 can be totally immersed in the encapsulant 136 in the first epoxy station 80, with or without the matrix board 12 therein. This removes the need for the second epoxy operation in the second epoxy station 84. Although with this technique the thermal resistance between the two sides of the thermoelectric cooler may be slightly reduced, it can provide good thermoelectric performance with the added advantage of improved high volume, low cost manufacturing.

Figure 14:
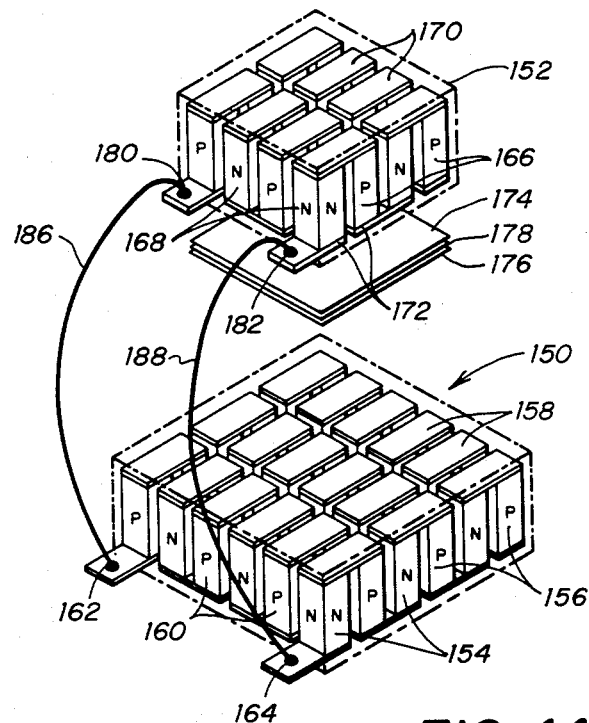
FIG. 14 illustrates an exploded view of a two-stage thermoelectric cooler.

Referring now to FIG. 14, there is illustrated an exploded view of a two stage cooler having a first stage 150 and a second stage 152. Each of the stages 150 and 152 is encapsulated in accordance with the present invention, as illustrated by phantom lines. The first stage 150 has a plurality of N-type elements 154 and a plurality of P-type elements 156 disposed in an alternating array. A plurality of connecting tabs 158 is disposed on one side of the first stage 150 to connect adjacent ones of the N-type elements 154 and the P-type elements 156 together in a predetermined pattern. A plurality of connecting tabs 160 is connected to adjacent ones of the elements 154 and 156 on the opposite side of the first stage 150 in a predetermined manner. Of the tabs 160, there are two extending tabs 162 and 164 to allow connection of opposite ends of the circuit. Although not described above, the connecting tabs are disposed on opposite sides of the thermoelectric cooler to form a series circuit wherein current passes from one side to the other in an alternating fashion until all of the elements in the thermoelectric cooler have current passing therethrough. To effect this, it is necessary to access both ends of the resulting circuit to apply a potential thereacross. In order to provide adequate thermal conductivity through the upper and lower surfaces, the encapsulating epoxy layers can be removed down to the connection tabs. This is necessary to provide a reasonably flat surface and a low thermal resistance between both the two stages and the external heat sinks to which the assembled unit is attached.

The second stage 152 has a plurality of P-type elements 166 and a plurality of N-type elements 168 disposed in an alternating array. Connecting tabs 170 are disposed on one side of the second stage 152 to connect adjacent ones of the elements 166 and 168 and connecting tabs 172 are disposed on the opposite side of the second stage 152 to connect adjacent ones of the elements 166 and 168. The pattern for the tabs 170 and 172 is determined by the desired conductive path.

A layer of electrically insulating film 174 is disposed adjacent the undersurface of the second stage 152 and a layer of electrically insulating film 176 is disposed adjacent the upper surface of the first stage 150. The electrical insulating films 174 and 176 provide an electrical insulation to prevent shorting out of the respective tabs adjacent thereto. A layer of thermal conducting material 178 is disposed between the electrical insulating layers 174 and 176 to provide good thermal conductance therebetween. In the exemplary embodiment, the thermal conducting layer is a copper plate or other material having a high thermal conductivity. The electrical insulating layers 174 and 176 are thin layers of epoxy that, in addition to insulating the two stages, cement the two stages together. Since the potential between the first stage 150 and the second stage 152 is in the range of millivolts, the dielectric strength of the electrical insulators 174 and 176 and the thermal conductance of layer 178 are important.

The second stage 152 has two connecting tabs 180 and 182 that are part of the tabs 172 on the lower side thereof. The tabs 180 and 182 extend outward therefrom in a manner similar to the tabs 162 and 164 on the first stage 150. A connecting lead 186 is connected between the tab 180 and the tab 162 and a connecting lead 188 is connected between the tabs 182 and 164. The connecting leads 186 and 188 place the two stages 150 and 152 in a parallel configuration.

By disposing one stage on top of another, two thermal gradients result. The first thermal gradient is formed between the upper sides of the second stage 152 and the lower side thereof. The second thermal gradient is formed between the upper side of the first stage 150 and the lower side thereof.

Figure 15:
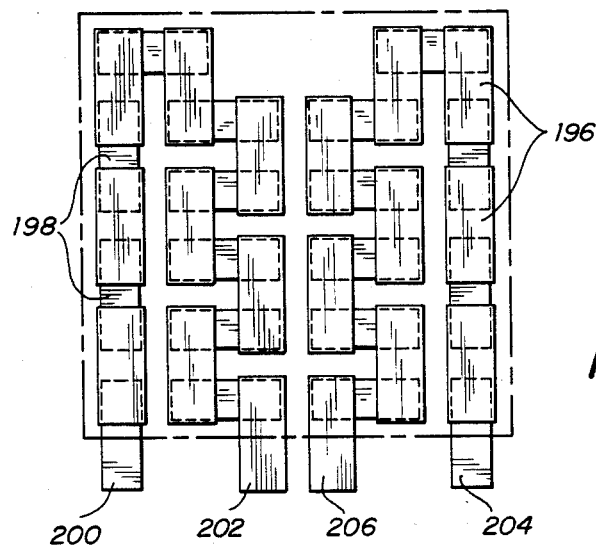
FIG. 15 illustrates a planar view of the interconnection of the lower stage of the two-stage thermoelectric cooler of FIG. 14.
Figure 16:
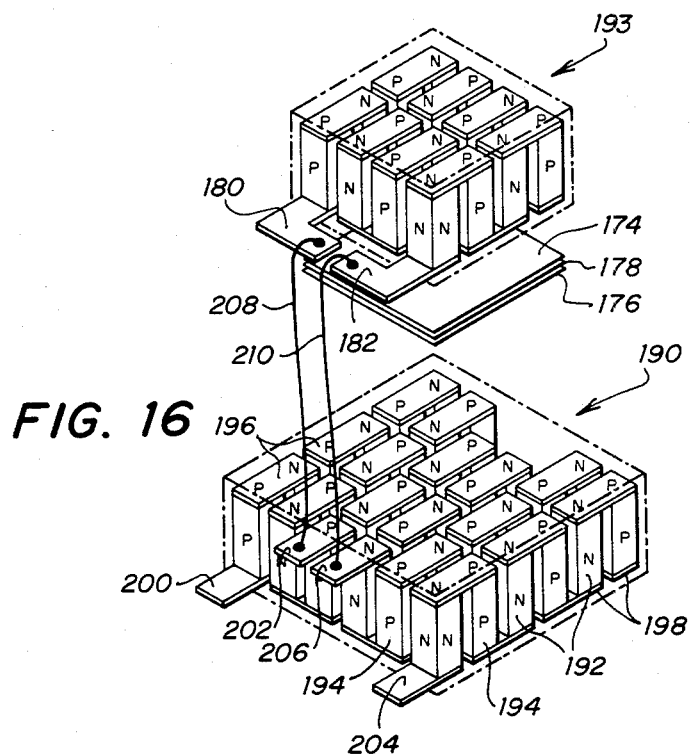
FIG. 16 illustrates an exploded view of another embodiment of the two-stage thermoelectric cooler of FIG. 14.

Referring now to FIGS. 15 and 16, there is illustrated an alternate embodiment of the two-stage configuration with FIG. 15 illustrating a top view of the interconnection diagram for the tabs of the lower stage and FIG. 16 illustrates an exploded view of the alternate embodiment. The two-stage configuration of FIG. 16 includes a first stage 190 and a second stage 192. The second stage 193 is identical to the second stage 152 in FIG. 14. In the first stage 190, a plurality of N-type elements 192 and a plurality of P-type elements 194 are arranged in a predetermined array according to the method and apparatus of the present invention.

A plurality of tabs 196 is disposed on the upper surface of the first stage 190 to interconnect adjacent ones of the N-type elements 192 and P-type elements 194 in a predetermined pattern, as illustrated in FIG. 15. A plurality of tabs 198 is disposed on the lower surface of the first stage 190 in a predetermined pattern, as illustrated in FIG. 15. Referring to FIG. 16, the tabs 196 and 198 are configured such that the P-type elements 194 and the N-type elements 198 are connected in two sections such that current can be input into one section on a connecting tab 204, which is one of the lower tabs 198. The other section has a connecting tab 200, which is one of the lower connecting tabs 198, and a connecting tab 202, which is one of the upper connecting tabs 196. The second stage 193 is thermally attached to the first stage 190 in a similar manner to the attachment of the first stage 150 and the second stage 152, wherein like numerals refer to like parts in the two figures.

A connecting lead 208 is connected between the connecting tabs 180 and the connecting tab 202 and a connecting lead 210 is connected between the connecting tab 182 and the connecting tab 206. In this configuration, a voltage can be impressed across the tabs 204 and 200 such that current flows from the tab 204 to the tab 206 through the elements therebetween and into the tab 182. The current flows from the tab 182 to the tab 180 through a second stage 192 and through the elements therebetween and to the tab 202. The current flows from the tab 202 to the tab 200 and through the elements therebetween. In this manner, the two circuits are connected in series with the external connections made only to the first stage. Although FIG. 16 shows a two stage device, it will be understood that additional stages could be fabricated according to the invention.

In summary, there has been provided a method and apparatus for forming a thermoelectric device. A matrix board is formed with a plurality of orifices disposed therein at a predetermined spacing and configuration. A wafer of P-type material is segmented into individual elements with a pattern corresponding to the pattern in the matrix board. Individual ones of these elements are then inserted into predetermined orifices of the matrix board. An N-type wafer is also segmented similar to the segmentation of the P-type wafer and individual ones of the elements therein are inserted into the remaining orifices in the matrix board. The N-type and P-type elements are configured in an alternating array with the distance therebetween defined by the matrix board. Connecting tabs are then disposed on the surface of the N-type and P-type elements to bridge between adjacent ones thereof. The matrix board provides the spacing of the elements such that the tabs can be aligned with a higher degree of accuracy and all of the tabs can be disposed thereon at one time in a predetermined pattern. The tabs are then soldered by reflow soldering techniques to the elements. Tabs are then placed on the opposite side of the assembly such that interconnection are made on both sides thereof. This facilitates a series circuit which can be connected to an external voltage supply to provide the necessary current to form a thermoelectric cooler. The assembly is then encapsulated to improve the thermal properties thereof. During the encapsulation procedure, a void is formed within the middle of the assembly and evacuated or, alternatively, filled with an inert gas. The present invention thus facilitates low-cost automated manufacturing, while maintaining excellent device performance.

Although the preferred embodiment has been described in detail, it should be understood that various changes, substitutions and alterations can be made therein without departing from the spirit and scope of the invention as defined by the appended claims.

What is claimed is:

1. A method of fabricating a thermoelectric device comprising:
   simultaneously depositing a plurality of first conductivity type thermoelements in a matrix member in a first spaced apart configuration;
   simultaneously depositing a plurality of second conductivity type thermoelements in the matrix member in a second spaced apart configuration to form an alternately disposed array of first and second conductivity type thermoelements within the matrix member; and
   depositing and securing in a predetermined pattern a plurality of conductive members on opposite sides of said array of first and second type thermoelements in order to connect the thermoelements in series.

2. The method of claim 1 and further comprising:
   removing the matrix member from the array; and
   encapsulating said array such that a void area is defined within the central portion of the encapsulated array.

3. The method of claim 2 and further comprising providing the void area with a pressure less than atmospheric.

4. The method of claim 2 wherein the matrix member is removed by dissolving with a chemical which does not affect the array.

5. The method of claim 1 wherein the steps of simultaneously depositing comprise:
   picking up a plurality of thermoelements prearranged in the spaced apart configuration;
   transporting the thermoelements in the prearranged spaced apart configuration to a location above the matrix member; and lowering the thermoelements into the matrix member.

6. The method of claim 5 wherein the thermo elements are held in the prearranged spaced apart configuration by vacuum.

7. A method of fabricating a thermoelectric device comprising:
   forming a supporting matrix with a plurality of orifices therein in an array configuration;
   forming a plurality of thermoelectric elements of a first conductivity type dimension to fit in the orifices;
   disposing in one step the first type elements into alternate ones of the orifices in the matrix array;
   forming a plurality of thermoelectric elements of a second conductivity type dimensioned similar to the first type element;
   disposing in one step the second type elements into remaining ones of the orifices in the matrix array; and
   disposing and securing a plurality of conductive bridges on opposite sides of the array of first and second type elements in a pattern that connects the distal ends of adjacent ones of the first and second type elements together to form an electrical series connection.

8. The method of claim 7 wherein the orifices are of equal size and equal spacing therebetween.

9. The method of claim 7 wherein the first and second type elements are of an elongated configuration having a length greater than the width of the supporting matrix and disposed in the supporting matrix such that the supporting matrix is about the midportion of each of the first and second type elements.

10. The method of claim 7 wherein the first type elements are of an N-type conductivity and the second type elements are of a P-type conductivity.

11. The method of claim 7 wherein the step of forming the first type elements comprises:
    forming a wafer of the first conductivity type; and
    dicing the wafer into a plurality of rectangular first type elements, the orifices in the supporting matrix being of a rectangular type also.

12. The method of claim 11 wherein the step of disposing the first or second type elements into the matrix array comprises:
    selectively attaching desired ones of the first or second type elements, respectively, on the upper portions thereof to a mobile platform;
    moving the mobile platform over the supporting matrix board such that the first or second type elements attached thereto are aligned over the respective ones of the orifices; and
    releasing the respective ones of the first or second type elements into the respective orifices.

13. The method of claim 12 wherein the step of attaching comprises applying a vacuum to the respective ones of the first or second type elements and the step of releasing comprises releasing the vacuum.

14. The method of claim 12 wherein the step of attaching comprises applying a vacuum to the respective ones of the first or second type elements and the step of releasing comprises releasing the vacuum applied to the respective ones of the first or second type elements and creating a positive pressure thereto.

15. The method of claim 7 wherein the step of disposing and securing the conductive bridges comprises:
    forming an array of first conductive bridges in a first predetermined pattern, the conductive bridges dimensioned to bridge between adjacent first and second type elements on the distal ends thereof with respect to the supporting matrix;
    disposing in one step the first conductive bridges on one side of the array of first and second type elements, the first predetermined pattern bridging pairs of first and second type elements;
    securing the first array of conductive bridges to the respective surfaces of the first and second type elements;
    forming a second array of conductive bridges in a second predetermined pattern, the conductive bridges in the second array dimensioned similar to the conductive bridges in the first array;
    disposing in one step the second array of conductive bridges on the opposite side of the array of first and second type elements, the second predetermined pattern bridging pairs of first and second type elements to bridge between elements that were not bridged between on the one side of the array of first and second type elements; and
    securing the second array of conductive bridges to the surfaces of the first and second type elements.

16. The method of claim 7 further comprising encapsulating the array of first and second type elements disposed in the supporting matrix board.

17. The method of claim 7 further comprising encapsulating the peripheral surfaces of the array of first and second type elements disposed in the supporting matrix board to form a void in the center thereof.

18. The method of claim 17 wherein the supporting matrix is removed prior to final encapsulation of the peripheral surfaces of the array of first and second type elements.

19. The method of claim 17 further comprising disposing a low thermal conductance material within the void.

20. The method of claim 17 further comprising creating a vacuum within the void during formation of the peripheral surfaces.

21. The method of claim 7 further comprising removing the supporting matrix by dissolving thereof.

22. A method for fabricating a thermoelectric device, comprising:
    forming a supporting matrix with a plurality of orifices formed therein in an array configuration;
    forming a plurality of thermoelectric elements of a P-type conductivity dimensioned to fit in the orifices;
    arranging the P-type elements in a subarray, the subarray configured identical to the supporting matrix array;
    selecting alternate ones of the P-type elements in the subarray and transporting them as a single unit over the supporting matrix and simultaneously disposing the selected ones of the P-type elements in alternate ones of the orifices;
    forming a plurality of thermoelectric elements of an N-type conductivity;
    arranging the N-type elements in a subarray identical to the supporting matrix array;
    selecting alternate ones of the N-type elements in the subarray and transporting them as a single unit over the supporting matrix with the P-type elements therein and disposing the selected N-type elements into the remaining ones of the orifices;

forming a first array of conductive bridges in a first predetermined pattern, the conductive bridges dimensioned to bridge between adjacent P and N-type elements on the distal ends thereof with respect to the supporting matrix;

disposing in one step the first array of bridges on one side of the array of P and N-type elements, the first array bridging alternate pairs of P and N-type elements;

securing the first array of bridges to the surfaces of the P and N-type elements;

forming a second array of conductive bridges in a second predetermined pattern, the bridges therein dimensioned identical to the bridges in the first array;

disposing in one step the second array of bridges on the opposite side of the array of the P and N-type elements, the pattern of the second array bridging between the pairs bridged by the first array of bridges such that a series circuit of alternating P and N-type elements is formed; and securing the second array of bridges to the respective surfaces of the P and N-type elements in the supporting matrix.

23. The method of claim 22 further comprising encapsulating the P and N-type elements in the supporting matrix.

24. The method of claim 22 further comprising encapsulating the peripheral boundaries of the array of first and second type elements to form a void in the center thereof.

25. The method of claim 24 wherein the void in the center of the array has a vacuum formed therein.

26. The method of claim 24 wherein a gas is disposed in the void.

27. A method of fabricating a multi-stage thermoelectric device, comprising:

forming a plurality of thermoelectric stages comprising the steps of:
simultaneously depositing a plurality of first conductivity type thermoelements in a matrix member in a first spaced apart configuration,
simultaneously depositing a plurality of second conductivity type thermoelements in the matrix member in a second spaced apart configuration to form an alternately disposed array of first and second conductivity type thermoelemenets within the matrix member, and
depositing and securing in a predetermined pattern a plurality of conductive members on opposite sides of said array of first and second type thermoelements in order to connect the thermoelements in series;

disposing at least one of the thermoelectric stages adjacent another one of the thermoelectric stages such that respective members are proximate each other;

providing high thermal conductivity between the adjacent stages which electrically insulate the adjacent stages from each other; and attaching the adjacent stages together.

28. A system for fabricating thermoelectric arrays comprising:

means for separating a body of a first conductivity type material into a plurality of first type elements;
a matrix defining a plurality of cells;
first means for transporting selected ones of said first type elements to said matrix and simultaneously depositing said first type elements in alternate ones of said cells;

means for separating a body of a second conductivity type material into a plurality of second type elements;

second means for transporting selected ones of said second type elements to said matrix and simultaneously depositing said second type elements in alternate ones of said cells, wherein said matrix is filled with alternating first and second type elements; and means for electrically connecting contacts to said alternating first and second type elements to form a thermoelectric array.

29. The system of claim 28 wherein said matrix is formed of a rectangle of rectangular cells wherein said bodies of first and second type conductivity material are separated to form elements dimensioned similar to said cells, said first transporting means removing alternating ones of said elements from said first type body for deposit in said matrix and said second transporting means removing alternating ones of said elements from said second-type body for deposit in said matrix.

30. The system of claim 28 wherein said first conductivity type is a semiconductor material having a P-type doping and said second conductivity type is a semiconductor material having an N-type doping.

31. The system of claim 28 wherein said first and second means for transporting comprises a vacuum chuck with a plurality of orifices disposed therein for being disposed adjacent the selected ones of said first or second type elements, respectively, that are to be selected, said vacuum chuck mobile to transport the respective ones of said first or second type elements to said matrix.

32. The system of claim 28 further comprising means for encapsulating the array of first and second type elements in said matrix board.

33. The system of claim 28 further comprising means for encapsulating the peripheral surfaces of the array of said first and second type elements disposed in said matrix such that a void is formed in the center portion thereof.

34. The system of claim 33 further comprising means for drawing a vacuum on said void.

35. The system of claim 33 further comprising means for introducing a low thermal conductivity material into said void 36. The system of claim 28 further comprising means for removing the matrix by dissolving thereof after said first and second type elements are electrically connected.

37. A thermoelectric device comprising:
a plurality of P-type and N-type conductivity elements arranged in an alternating array;
contacts electrically connecting said elements together to form a series of P-N junctions;
encapsulating material sealing the exterior surfaces of said elements to form a unitary body; and
a central void area being defined within said unitary body and communicating with central portions of each of said elements, said void area having a low thermal conductance.

38. A system for fabricating a thermoelectric device, comprising:
a matrix having a plurality of orifices disposed in a planar array;

means for forming a plurality of P-type conductivity thermoelectric elements;

means for arranging said P-type elements in a subarray, said subarray similar to said matrix array;

means for selectively transporting alternating ones of said P-type elements in said subarray to said matrix array and simultaneously depositing said selected P-type elements therein;

means for forming a plurality of N-type conductivity thermoelectric elements;

means for arranging said N-type elements into a subarray similar to said matrix array;

means for selectively transporting alternating ones of said N-type elements to said matrix array and simultaneously depositing said selected N-type elements into the remaining ones of said orifices in said matrix array wherein selected P and N-type elements are disposed in said matrix array in an alternating pattern, said matrix array disposed about the midportions of said selected P and N-type elements; and means for electrically connecting alternating ones of said P and N-type elements in a series configuration to form a P-N thermoelectric device.

39. The system of claim 38 wherein said means for connecting comprises:

a plurality of conductive bridges;

solder for being disposed on said thermoelectric elements;

means for arranging a portion of said conductive bridges in a first predetermined array;

means for transporting said bridges in said first array to one side of the array of selected P and N-type elements to conductively bridge between adjacent ones of said P and N-type elements;

means for reflowing said solder to attach said conductive bridges to the surfaces of the said selected P and N-type elements;

means for arranging said conductive bridges in a second array;

means for transporting said conductive bridges in said second array to the opposite side of the array of said selected P and N-type elements to bridge between said selected P and N-type elements to form a series connected circuit thereof; and means for reflowing the solder on said connective conductive bridges in said second array for securing thereof.

40. The system of claim 38 further comprising means for encapsulating the peripheral surfaces of the array of said P and N-type elements to form a void in the center portion thereof.

41. The system of claim 38 further comprising means for removing the matrix array from the secured ones of said selected P and N-type elements.

42. A thermoelectric device, comprising:

a first stage having a plurality of alternating P-type and N-type elements connected together in a series configuration to provide a thermoelectric effect;

a second stage having a plurality of P-type and N-type thermoelements connected together in a series configuration to provide a thermoelectric effect;

a thermally conducting plate disposed between said first and second stages; and means for attaching said first and second stages together with said plate disposed therebetween, said attaching means providing electrical insulation between said first and second stages.

43. The device of claim 42 wherein said means for attaching comprises a layer of thermally conductive epoxy disposed between said first stage and one surface of said plate and a layer of thermally conductive epoxy disposed between said second stage and the other surface of said plate.

* * * * *